United States Patent
Rubenstein et al.

(10) Patent No.: US 6,662,411 B2
(45) Date of Patent: Dec. 16, 2003

(54) MUSHROOM HEAD CLIP FASTENER

(75) Inventors: Brandon A. Rubenstein, Loveland, CO (US); Bradley E. Clements, Fort Collins, CO (US); Angela L. Minichiello, Millville, UT (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/091,083

(22) Filed: Mar. 4, 2002

(65) Prior Publication Data

US 2003/0163905 A1 Sep. 4, 2003

(51) Int. Cl.$^7$ ................................. A44B 17/00
(52) U.S. Cl. .................. 24/453; 24/462; 411/509; 361/704; 165/80.3
(58) Field of Search .................. 24/628, 297, 457, 24/453, 458, 459, 462, 546; 411/508–510, 913; 361/704; 165/80.3

(56) References Cited

U.S. PATENT DOCUMENTS

| | | | | |
|---|---|---|---|---|
| 3,271,059 A | * | 9/1966 | Pearson ........................ 411/509 |
| 3,897,967 A | * | 8/1975 | Barenyi ........................ 293/120 |
| 4,495,380 A | * | 1/1985 | Ryan et al. .................. 174/138 D |
| 5,677,829 A | * | 10/1997 | Clemens ...................... 361/697 |
| 5,754,412 A | * | 5/1998 | Clavin ......................... 361/804 |
| 5,775,863 A | * | 7/1998 | Anderson .................... 411/512 |
| 5,797,170 A | * | 8/1998 | Akeno .......................... 24/452 |
| 5,819,391 A | * | 10/1998 | Matsushima et al. ......... 24/452 |
| 6,247,591 B1 | * | 6/2001 | Grendol ....................... 206/343 |
| 6,398,473 B1 | * | 6/2002 | Kraus .......................... 411/508 |
| 6,457,217 B2 | * | 10/2002 | Yoshii et al. ................. 24/297 |
| 6,470,556 B2 | * | 10/2002 | Boe ............................ 29/450 |

* cited by examiner

*Primary Examiner*—Anthony Knight
*Assistant Examiner*—André L. Jackson

(57) ABSTRACT

A clip fastener includes a base and a clip head that is distant from the base. The clip head includes a barb having a rounded outer surface including a ramp that increases in diameter towards the base. An elongate clip neck connects the base with the clip head. The clip neck has sufficient resilience under compressive forces exerted on the rounded outer surface of the barb to permit movement of the barb. The clip may be formed as an individual unit for use in fastening operations, or it may be molded into component structures, such as fan carriers for computer fans.

12 Claims, 4 Drawing Sheets

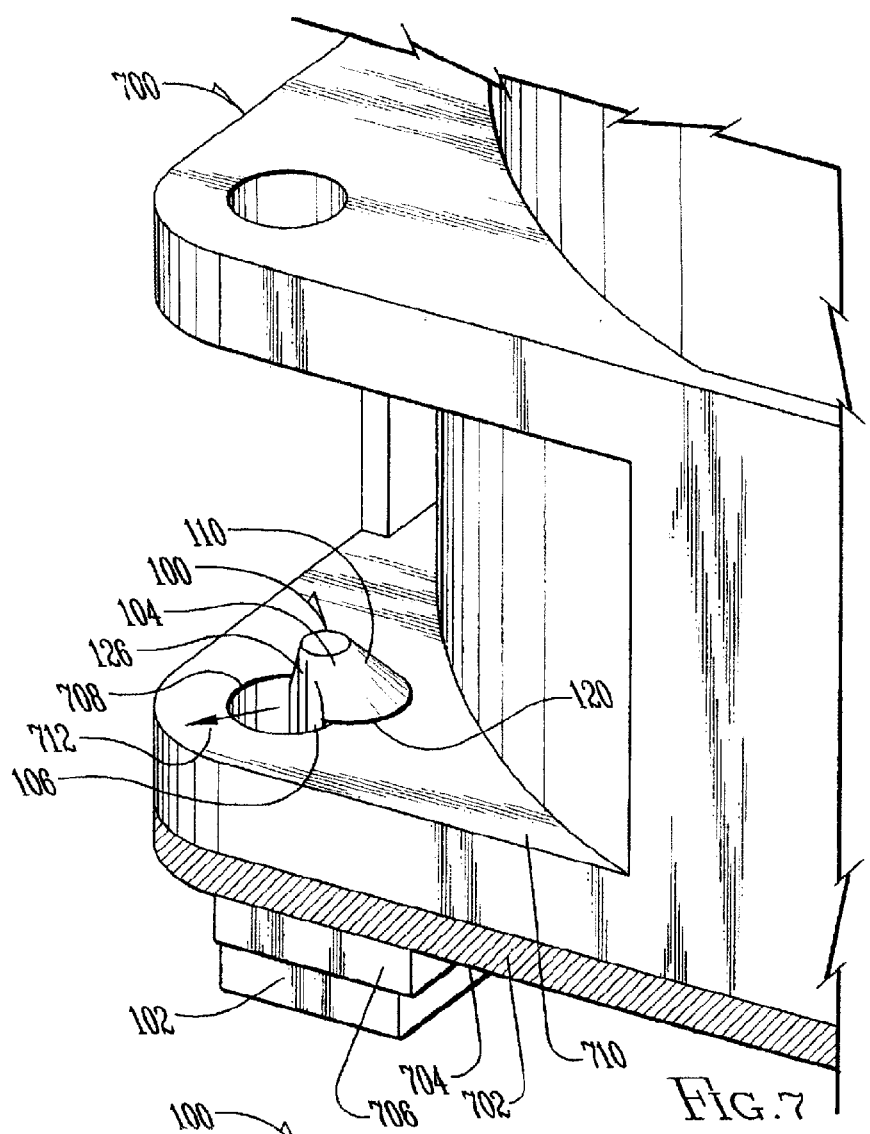
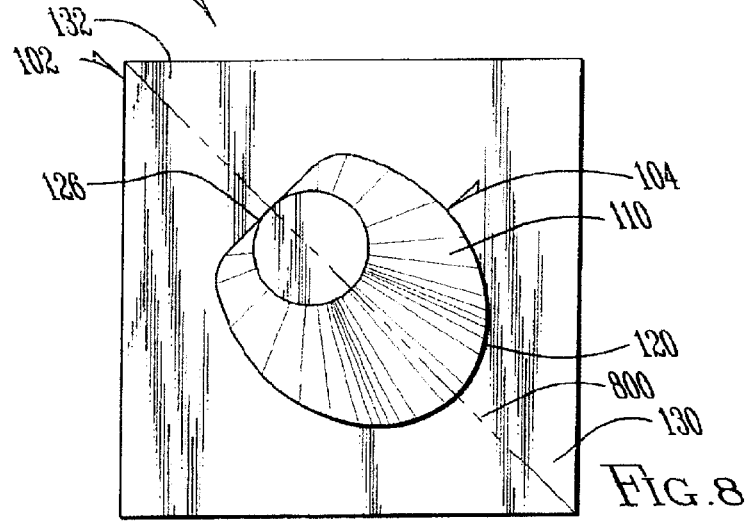

MUSHROOM HEAD CLIP FASTENER

BACKGROUND OF THE INVENTION

Discussion of the Related Art

The assembly of system components, for example, of computers and the like, can be slow and costly where threaded fasteners are commonly used. Clip fasteners may be used to expedite assembly operations, but the resulting assembly has the appearance and feel of cheap or shoddy construction because it is shiftable due to the loose tolerances that are required to accommodate the fasteners. One such type of fastener is a mushroom-headed clip where the umbrella of a round and deformable mushroom head collapses under compressive forces while the head passes through a hole. The head then expands on the backside of the hole, but the clip is permanently attached such that the clip and assembly cannot be easily detached for maintenance operations without damaging the clip or the components. Withdrawing the clip is akin to removing a barbed arrow from something into which the arrow was shot or inserted.

Clip fasteners may expedite assembly operations, but the assembled components problematically shift in position relative to one another. For example, a fan housing that is squarely connected to a computer chassis may shift relative to the computer chassis, such that the alignment between the fan housing and the chassis is no longer square. Even though the fit is sloppy, the clip fasteners are difficult or impossible to remove.

SUMMARY OF THE INVENTION

The clip fastener according to the present invention overcomes the problems that are outlined above and advances that art by providing a clip fastener that is quick and easy to attach for permanent fastening uses, yet is stable in the sense of forming a rigid coupling and is selectively detachable.

The clip fastener includes a base and a clip head. An elongate clip neck connects the base with the clip head. The clip head includes a barb having a rounded outer surface that increases in diameter towards the base. The clip neck has sufficient resilience under compressive forces exerted on the rounded outer surface of the barb, e.g., by virtue of contact with the inner surface of a hole into which the clip head is being inserted, to bend the clip neck with associated movement of the barb for clip insertion purposes. The barb or clip head may also deform to accommodate insertion.

In some embodiments, by way of example, the rounded outer surface of the barb has a semi-frustoconical shape with a flattened rear surface. The clip neck may have a semicircular cross-section with a flattened side aligned with the flattened rear surface to facilitate bending movement in an oriented direction.

The base may contain an aperture through which the clip neck extends to provide additional support from the rear surface of the clip neck. The base may comprise a block, and the barb may be oriented for bending motion diagonally across the block to obtain maximum lateral stability from the dimensions of the block. The base may be formed as part of an individual or stand-alone clip, or integrally formed into one of the components, such as an integrally formed part of a fan carrier. A plurality of clip fasteners, such as those formed into a fan carrier that has the general shape of a parallelogram, may be placed in diagonal alignment across the parallelogram such that the respective bending moments of the individual clip fasteners are each diagonally opposed to a corresponding clip fastener.

The clip fastener may be used in a method of fastening components to one another. The method includes the steps of positioning a first component having the clip fastener adjacent a hole for receipt of the clip fastener in a second component; and establishing compressive forces on the barbed tip by the action of the hole on the barb tip. The compressive forces are sufficient to bend the clip neck for passage of the barbed tip through the hole. Passing the barbed tip through the hole to establish a clip connection between the barbed tip and the second component completes insertion of the clip fastener, which may be selectively detached by manually manipulating the barb to disengage it from the second component for subsequent withdrawal from the hole.

The clip fastener may include a first object, such as a base plate, fan housing, or any other type of manufactured component, which incorporates a resilient male member having a barb. A second such object includes any complimentary receiving structure, such as a nib, hole or slot, for receiving the resilient male member to establish clipped interengagement between the first object and the second object. The resilient male member has a clip neck that flexes with corresponding movement of the barb. The barb has a head with an abutment surface, e.g., as a ramp, that abuts the complimentary receiving structure during insertion of the male member with resultant transfer of forces to flex the clip neck until clipped interengagement is established. The interengagement between the resilient male member and the complimentary receiving structure is established by the resilient male member snapping into a resting position upon loss of contact between the abutting means and the receiving means when the resilient male member is fully inserted into the complimentary receiving structure.

BRIEF DESCRIPTION OF THE DRAWINGS

FIG. 7 depicts a clip fastener connecting a first component to a second component; and FIG. 8 is a top plan view of the clip fastener shown in FIG. 1.

DETAILED DESCRIPTION OF THE DRAWINGS

The following detailed description illustrates a clip fastener having a base, a clip head, and a flexible clip neck that flexes sufficiently to permit passage of the clip head through a corresponding opening for clip fastening purposes. The use of a preferred example should not be construed to impart undue limitation to the concepts that are disclosed herein because the teaching is by way of example and not by limitation.

Figure 1:
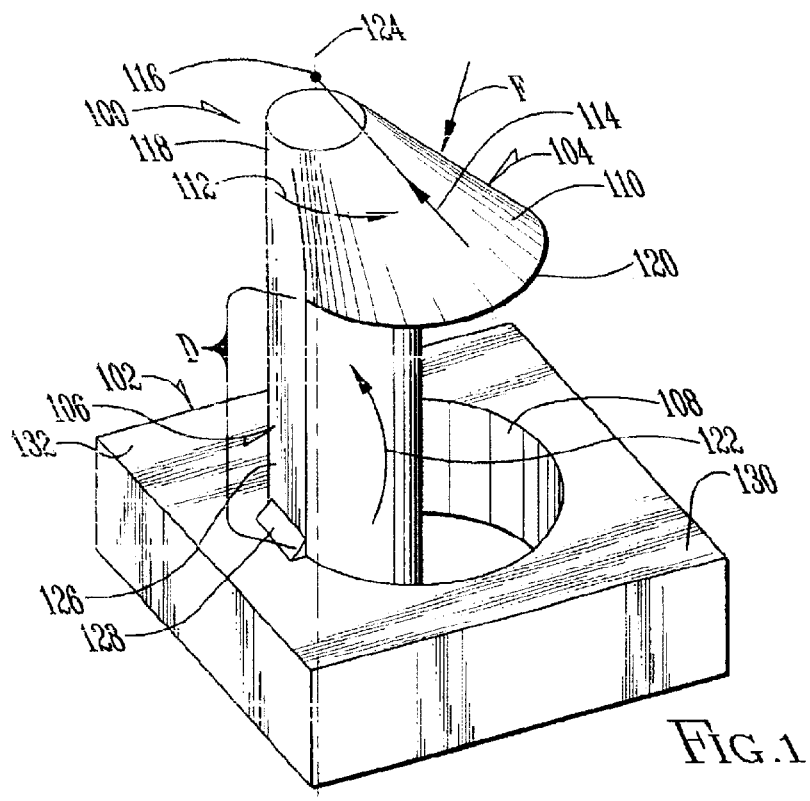
FIG. 1 is a top rear perspective view of a mushroom head clip fastener.

FIG. 1 is a top rear perspective view of a clip fastener 100, which is comprised of a base 102, a clip head 104, and a clip neck 106. The base 102, as shown in FIG. 1, is a square block having a central through aperture 108. The aperture 108 is conveniently formed for purposes of injection molding the clip fastener 100, and may optionally be omitted. The base 102 is shown as a parallelogram or square block in FIG. 1, but may be any other structure or shape.

The clip head 104 may be generally referred to as a mushroom clip due to a rounded outer surface 110 that increases in diameter towards the base 102. The clip head 104 has a semi-frustoconical shape presenting a curved abutment surface 112 with a transverse orientation to a generally straight or linear ramp along line 114 leading to an apex point 116. The apex point 116 is not located on the clip fastener 100, but is shown in FIG. 1 to present a geometrical illustration of a point of convergence for lines, such as line 114. The clip head 104 is hereby defined to have a semi-frustoconical shape because it has a flattened rear surface 118 that lends to the clip head 104 the general shape of a barb having a barb tip 120 remote from the flattened rear surface 118. Furthermore, the rounded surface 110 may optionally be oblong, e.g., with a semi-ovaloid crossection across the curved abutment surface 112, as opposed to having a semi-circular shape in the nature of a right circular frustocone.

The clip neck 106 may function as a flexible spring member that experiences a bending moment and flexes with resultant movement 122 when external forces F are placed upon the outer surface 110 of clip head 104. The movement 122 correspondingly moves barb tip 120 rearwardly a sufficient distance to facilitate clip insertion into complimentary clip mating structure (not shown in FIG. 1). It is generally seen that the clip neck 106 and the clip head 104 with barb 120, in combination, form a male member, and that complimentary mounting structure to be discussed in additional detail below may be any type of compatible receptacle, such as a hole, aperture, catch or slot.

Clip neck 106 is elongate along axis 124 for a distance D that is sufficiently short so that the clip fastener 100 has a snug fit with complimentary mating structure, i.e., a distance that precisely accommodates structure that is intended to occupy the interval between the base 102 and the barb tip 120. As shown in FIG. 1, clip neck 106 has a semicircular cross-section with a flattened rear surface 126 that is aligned with the flattened rear surface 118 of clip head 104. A support radius 128 adjoins the flattened rear surface 126 with the base 102 to impart additional strength. The flattened rear surfaces 118 and 126 are optionally provided to reduce the amount of force that is required for movement 122, as compared to the increased amount of force F that would be required for bending purposes if the surfaces 118 and 126 were round. Movement 122 places the flattened rear surface 126 into a concave configuration. Clip neck 106 may alternatively, for example, be flattened in the manner of a leaf spring to further reduce the required bending moment to establish movement 122.

The clip neck 106 connects the base 102 with the clip head 104 and optionally but preferably orients barb tip 120 towards a corner, such as corner 130, of base 102. This also orients the bending moment associated with movement 122 diagonally across the block shape of base 102 between corners 130 and 132 to obtain maximum lateral stability from base 102. By way of example, FIG. 8 is a top plan view that shows the barb tip 120 aligned along diagonal 800 to obtain diagonal stability from base 102.

Figure 2:
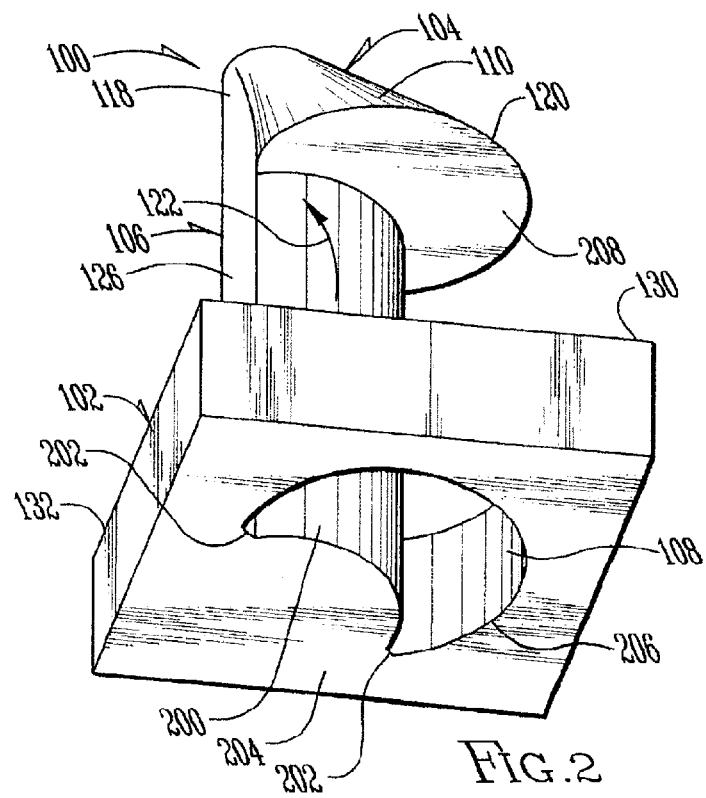
FIG. 2 is a bottom rear perspective view of the clip fastener.

FIG. 2 is a bottom rear perspective view of the clip fastener 100 that reveals a through portion 200 of clip neck 106 extending through the aperture 108. The aperture 108 may have a circular cross-section with flattened regions 202 adjacent the portion 200. The portion 202 extends through aperture 108 until side 204 is even with edge 206 on the underside of base 102. The underside 208 of clip head 104 may be hollow or solid. Where the underside 208 is hollow, the wall structure forming rounded outer surface 110 is increasingly collapsible. Thus, an optional resilient hollow form of clip head 104 may collapse under forces F to reduce or eliminate the magnitude of movement 122 that is required for clip insertion purposes. The hollow clip head 104 subsequently expands following clip insertion.

Figure 3:
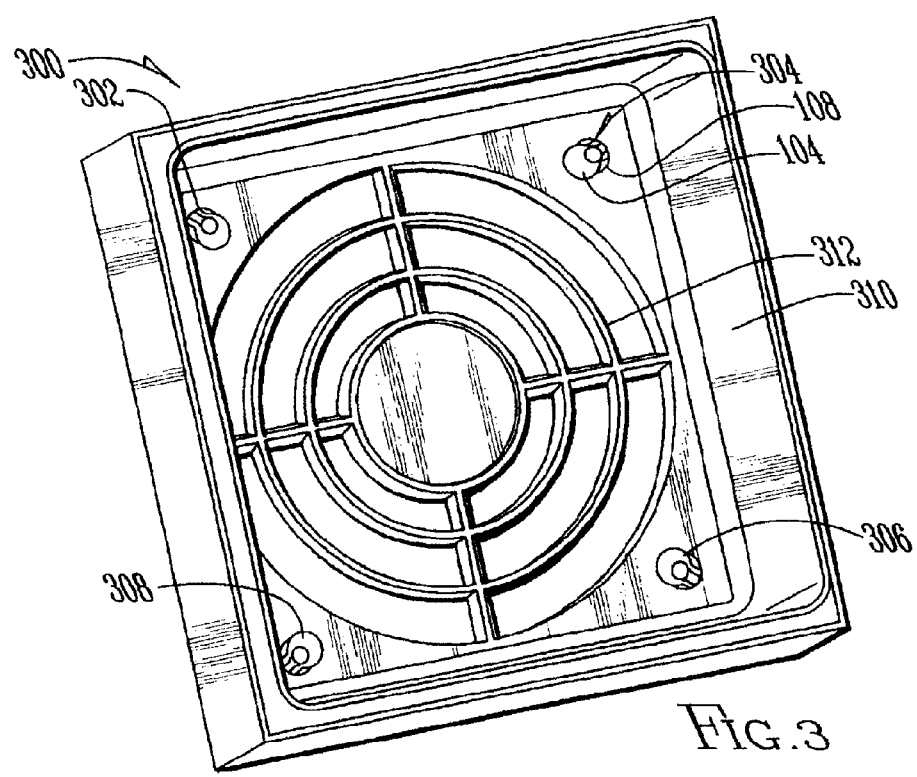
FIG. 3 is a top perspective view of a fan carrier housing that functions as a base incorporating a plurality of clip fasteners generally of the type shown in FIG. 1.

FIG. 3 is a top perspective view of a fan carrier housing 300, which is integrally formed to have a plurality of clip fasteners 302, 304, 306, and 308. The clip fasteners 302–308 are identical to clip fastener 100, e.g., including clip head 104 and aperture 108, except the base 102 (shown in FIG. 1), has been replaced with the fan carrier housing 300 such that the clip head 104 and clip neck 106 are integrally formed with the fan carrier housing 300. The fan carrier housing 300 has a box fan receptacle and a protective grill 312.

Figure 4:
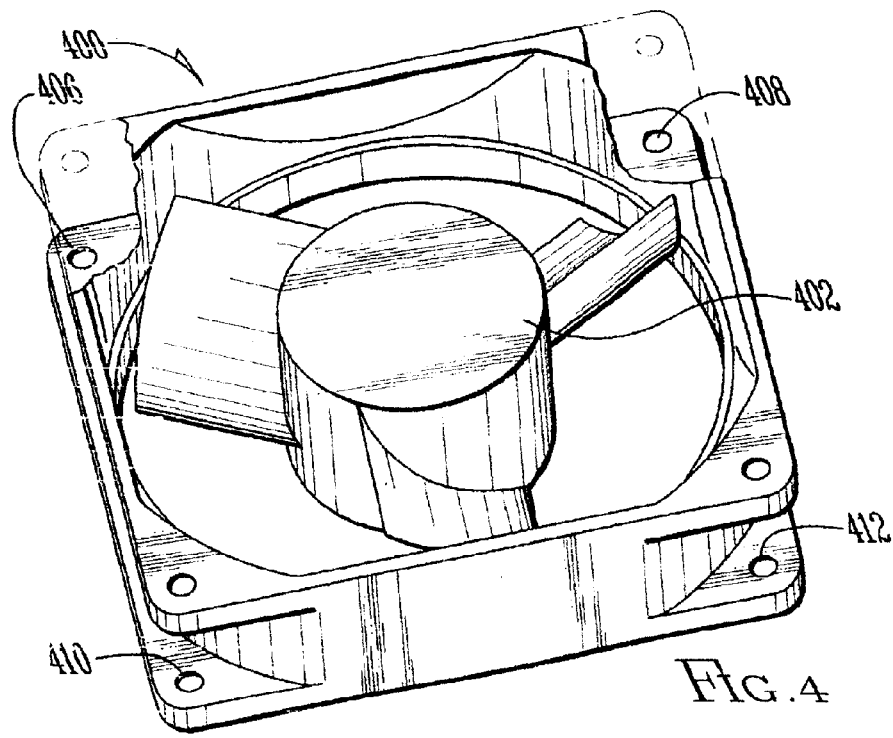
FIG. 4 is a top perspective view of a fan housing designed for mating engagement with the fan carrier housing of FIG. 3.

FIG. 4 is a top perspective view of a fan assembly 400 that includes a fan 402 centrally disposed in a fan housing 404. The fan 402 is separately attached to a motor (not shown) for support. Holes 406, 408, 410, and 412 form complimentary mating structure for engagement with the clip fasteners 302–308 that are shown in FIG. 3.

Figure 5:
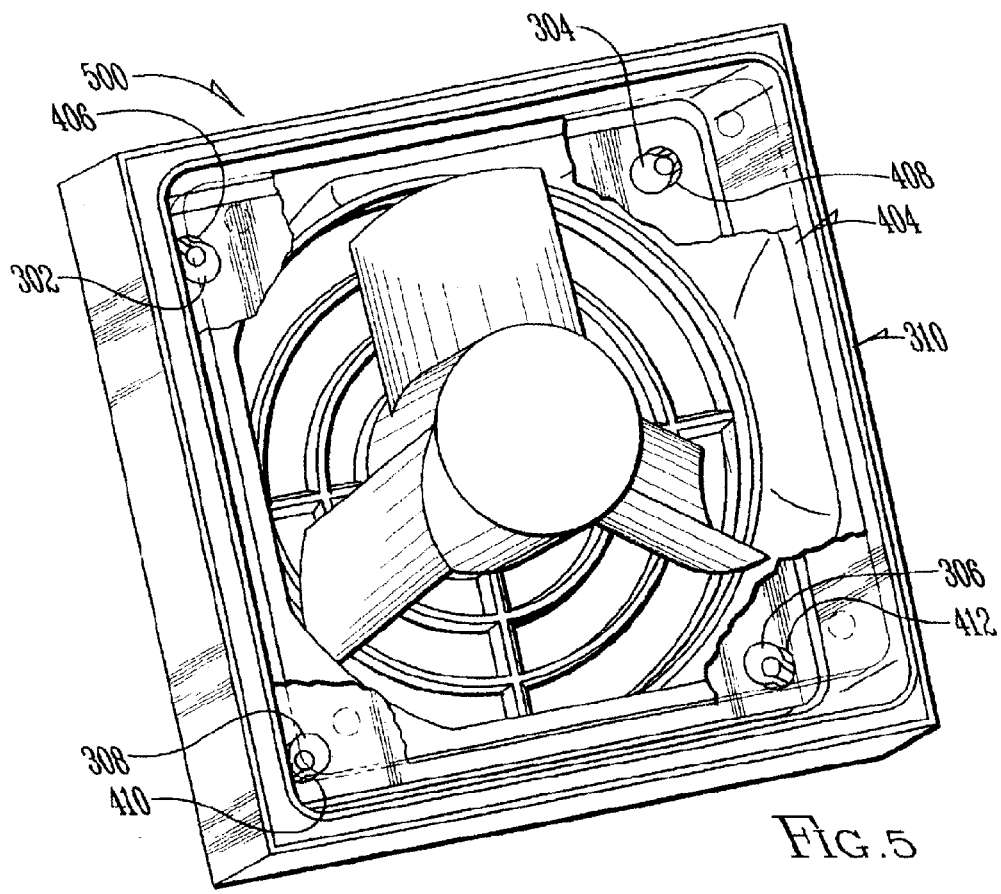
FIG. 5 depicts the fan carrier housing of FIG. 3 matingly engaged with the fan housing of FIG. 4.

FIG. 5 is a top plan view of a completed assembly 500 showing clip fasteners 302–308 of the fan carrier housing 300 (FIG. 3) in complimentary mating engagement with holes 406–412 of the fan assembly 400 (FIG. 4). The fan assembly 400 is received within the box receptacle 310 where it is retained by the clip fasteners 302–308.

Figure 6:
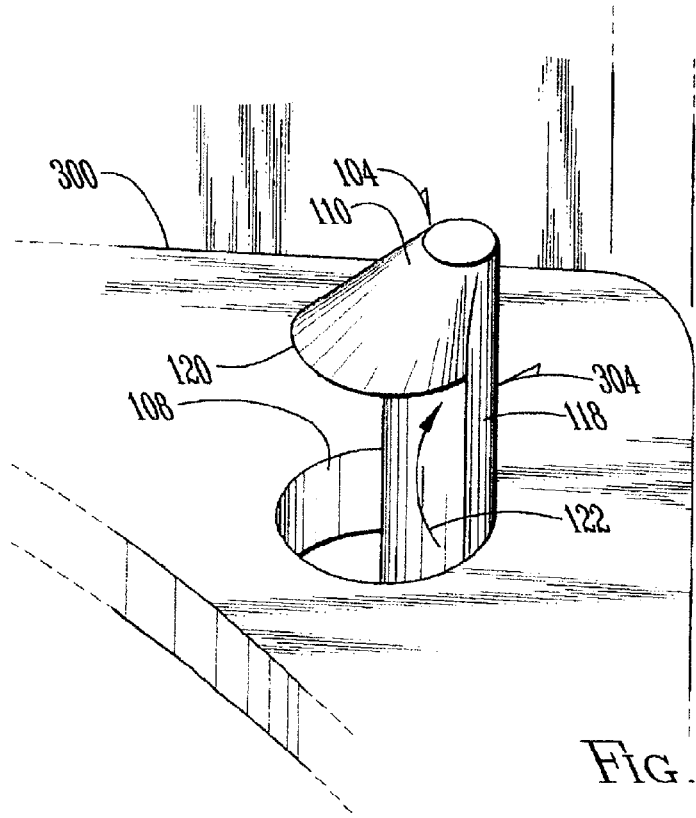
FIG. 6 provides additional detail with respect to a clip fastener on the fan carrier housing.

FIG. 6 provides additional detail with respect to clip fastener 304. The clip head 104, clip neck 106, and aperture 108 are identical to those components of identical numbers shown in FIGS. 1 and 2. The fan carrier housing 300 functions as a square or rectangular base, and the orientation of barb tip 120 is such that forces resisting the bending movement 122 are aligned inwardly and diagonally across the fan carrier housing 300.

FIG. 7 shows the clip fastener 100 of FIG. 1 deployed for fastening a first component 700 to a second component 702. The clip neck 106 is in tension between base 102 and clip head 104. The bottom surface 704 of second component 702 contains a socket 706 that is recessed to accommodate base 102 and prevent shifting of the same. Clip neck 106 protrudes through hole 708 such that barb tip 120 abuts surface 710. Hole 708 permits movement of clip neck 106 and clip head 104 in the direction of arrow 712 such that this movement under the force of manual manipulation may cause barb tip 120 to disengage surface 710 for removal of clip fastener 100 from hole 708.

In operation, the clip fasteners 100, 302–308, are positioned opposite complimentary mating structures, such as holes 406–412, 708. The outer surface 110 of clip head 104 contacts the mating structure during insertion, which imparts outward force F to the clip head 104 and that induces flexion movement 122 in clip neck 106, which snaps into place for locking engagement once barb tip 120 clears the complimentary mating structure.

The foregoing discussion is intended to illustrate the concepts of the invention by way of example with emphasis upon the preferred embodiments and instrumentalities. Accordingly, the disclosed embodiments and instrumentalities are not exhaustive of all options or mannerisms for practicing the disclosed principles of the invention. The inventors hereby state their intention to rely upon the Doctrine of Equivalents in protecting the full scope and spirit of the invention.

We claim:

1. A clip fastener for use in connecting objects, comprising:
   a base;
   a clip head including a barb having a ramped outer surface remote from the base,
   the ramped outer surface having a semi-frustoconical shape including a frustoconical ramp section truncating into a first edge, the first edge rising away from the base as the ramp tapers; and
   an elongate clip neck connecting the base with the clip head,
   the elongate clip neck having a second edge continuously rising towards the first edge,
   the elongate clip neck having sufficient resilience under compressive forces exerted on the ramped outer surface of the barb to permit bending with corresponding movement of the barb.

2. The clip fastener as set forth in claim 1, wherein the ramped outer surface of the barb is a rounded surface that increases in diameter towards the base.

3. The clip fastener as set forth in claim 1, wherein the elongate clip neck has a semicircular cross-section with the second edge being flat and aligned with the ramped outer surface, such that the bending under the compressive forces places the flattened side into a concave configuration.

4. The clip fastener as set forth in claim 1, wherein the clip head comprises a collapsible outer wall defining the outer surface, such that collapse of the clip head may reduce or eliminate the bending of the elongate clip neck during insertion of the clip fastener.

5. The clip fastener as set forth in claim 1, wherein the first edge and the second edge together form a continuous flat surface.

6. The clip fastener as set forth in claim 5, wherein the elongate clip neck has a semicircular cross-section with the second edge being flat and aligned with the ramped outer surface, such that the bending under the compressive forces places the flattened side into a concave configuration.

7. The clip fastener as set forth in claim 1, wherein the base contains an aperture therethrough connected to the elongate clip neck.

8. The clip fastener as set forth in claim 7, wherein the elongate clip neck has a portion that extends through the aperture for support.

9. The clip fastener as set forth in claim 1, wherein the base comprises a block.

10. The clip fastener as set forth in claim 9, wherein the barb is oriented for bending motion diagonally across the block.

11. The clip fastener as set forth in claim 1, wherein the base is integrally formed as part of a fan carrier.

12. The clip fastener as set forth in claim 11, wherein the fan carrier comprises a parallelogram and the bending movement is oriented diagonally across the parallelogram.

* * * * *